(12) United States Patent
Roy et al.

(10) Patent No.: US 10,672,713 B2
(45) Date of Patent: *Jun. 2, 2020

(54) HIGH DENSITY ORGANIC BRIDGE DEVICE AND METHOD

(71) Applicant: Intel Corporation, Santa Clara, CA (US)

(72) Inventors: Mihir K Roy, Chandler, AZ (US); Stefanie M Lotz, Phoenix, AZ (US); Wei-Lun Kane Jen, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/135,695

(22) Filed: Sep. 19, 2018

(65) Prior Publication Data

US 2019/0019755 A1 Jan. 17, 2019

Related U.S. Application Data (63) Continuation of application No. 15/350,393, filed on Nov. 14, 2016, now Pat. No. 10,103,105, which is a (Continued)

(51) Int. Cl.
*H01L 23/538* (2006.01)
*H01L 23/14* (2006.01)
(Continued)

(52) U.S. Cl.
CPC ...... *H01L 23/5386* (2013.01); *H01L 21/4853* (2013.01); *H01L 23/13* (2013.01);
(Continued)

(58) Field of Classification Search
USPC ........................................................ 174/261
See application file for complete search history.

(56) References Cited

U.S. PATENT DOCUMENTS 3,436,604 A * 4/1969 Luecke ............... H01L 23/5384
361/715
4,054,938 A * 10/1977 Morris, Sr. ............ H05K 1/182
361/764
(Continued)

FOREIGN PATENT DOCUMENTS

CN 104037161 A 9/2014
CN 104037161 B 3/2017
(Continued)

OTHER PUBLICATIONS

US 9,496,209 B2, 11/2016, Roy et al. (withdrawn)
(Continued)

*Primary Examiner* — William H. Mayo, III
*Assistant Examiner* — Krystal Robinson
(74) *Attorney, Agent, or Firm* — Schwegman Lundberg & Woessner, P.A.

(57) ABSTRACT

Embodiments that allow multi-chip interconnect using organic bridges are described. In some embodiments an organic package substrate has an embedded organic bridge. The organic bridge can have interconnect structures that allow attachment of die to be interconnected by the organic bridge. In some embodiments, the organic bridge comprises a metal routing layer, a metal pad layer and interleaved organic polymer dielectric layers but without a substrate layer. Embodiments having only a few layers may be embedded into the top layer or top few layers of the organic package substrate. Methods of manufacture are also described.

22 Claims, 4 Drawing Sheets

Related U.S. Application Data continuation of application No. 14/992,535, filed on Jan. 11, 2016, now Pat. No. 9,548,264, which is a continuation of application No. 13/722,203, filed on Dec. 20, 2012, now Pat. No. 9,236,366.

(51) Int. Cl.

| | | |
|---|---|---|
| *H01L 23/13* | (2006.01) | |
| *H05K 1/14* | (2006.01) | |
| *H01L 25/065* | (2006.01) | |
| *H01L 21/48* | (2006.01) | |
| *H01L 23/498* | (2006.01) | |
| *H05K 1/03* | (2006.01) | |
| *H05K 3/46* | (2006.01) | |
| *H01L 23/00* | (2006.01) | |
| *H05K 1/18* | (2006.01) | |
| *H05K 3/34* | (2006.01) | |

(52) U.S. Cl.
CPC ...... *H01L 23/145* (2013.01); *H01L 23/49811* (2013.01); *H01L 23/49866* (2013.01); *H01L 23/49894* (2013.01); *H01L 23/5381* (2013.01); *H01L 23/5383* (2013.01); *H01L 23/5384* (2013.01); *H01L 23/5385* (2013.01); *H01L 25/0655* (2013.01); *H05K 1/141* (2013.01); *H01L 24/16* (2013.01); *H01L 24/17* (2013.01); *H01L 24/81* (2013.01); *H01L 2224/16225* (2013.01); *H01L 2224/16227* (2013.01); *H01L 2224/16238* (2013.01); *H01L 2224/1703* (2013.01); *H01L 2224/81193* (2013.01); *H01L 2224/81203* (2013.01); *H01L 2924/0002* (2013.01); *H01L 2924/0665* (2013.01); *H01L 2924/12042* (2013.01); *H01L 2924/1579* (2013.01); *H01L 2924/15192* (2013.01); *H01L 2924/2064* (2013.01); *H05K 1/0313* (2013.01); *H05K 1/142* (2013.01); *H05K 1/181* (2013.01); *H05K 3/3436* (2013.01); *H05K 3/467* (2013.01); *H05K 2201/048* (2013.01); *H05K 2201/049* (2013.01); *H05K 2201/10522* (2013.01); *H05K 2201/10674* (2013.01); *H05K 2203/016* (2013.01)

(56) References Cited

U.S. PATENT DOCUMENTS

| | | | |
|---|---|---|---|
| 4,918,811 A | 4/1990 | Eichelberger et al. | |
| 5,019,535 A * | 5/1991 | Wojnarowski | H01L 23/5389 257/712 |
| 5,049,978 A * | 9/1991 | Bates | H01L 23/10 257/686 |
| 5,061,657 A | 10/1991 | Queen et al. | |
| 5,198,963 A * | 3/1993 | Gupta | G01R 31/2863 257/737 |
| 5,469,333 A | 11/1995 | Ellerson et al. | |
| 5,841,194 A * | 11/1998 | Tsukamoto | H01L 23/145 257/729 |
| 6,111,756 A * | 8/2000 | Moresco | H01L 23/5386 174/250 |
| 6,121,682 A * | 9/2000 | Kim | H01L 25/0657 257/686 |
| 6,163,956 A * | 12/2000 | Corisis | H01L 23/3672 29/832 |
| 6,541,308 B2 * | 4/2003 | Ito | H01L 21/563 257/E21.503 |
| 6,627,978 B2 | 9/2003 | Dujari et al. | |
| 8,064,224 B2 | 11/2011 | Mahajan et al. | |
| 8,102,663 B2 * | 1/2012 | Cunningham | H01L 23/48 361/760 |
| 8,492,197 B2 * | 7/2013 | Cho | H01L 21/4857 438/108 |
| 9,236,366 B2 | 1/2016 | Roy et al. | |
| 9,548,264 B2 | 1/2017 | Roy et al. | |
| 10,103,105 B2 | 10/2018 | Roy et al. | |
| 2006/0008975 A1 | 1/2006 | Gonzalez et al. | |
| 2007/0032089 A1 | 2/2007 | Nuzzo et al. | |
| 2007/0048888 A1 | 3/2007 | Christenson | |
| 2009/0042336 A1 | 2/2009 | Paik et al. | |
| 2009/0244874 A1 | 10/2009 | Mahajan et al. | |
| 2009/0321772 A1 * | 12/2009 | Shida | F21K 9/00 257/98 |
| 2010/0327424 A1 * | 12/2010 | Braunisch | H01L 23/13 257/692 |
| 2011/0233764 A1 | 9/2011 | Chang et al. | |
| 2011/0241208 A1 | 10/2011 | Mahajan et al. | |
| 2013/0341772 A1 | 12/2013 | Chase et al. | |
| 2014/0174807 A1 | 6/2014 | Roy et al. | |
| 2014/0175636 A1 * | 6/2014 | Roy | H01L 24/25 257/737 |
| 2016/0133552 A1 | 5/2016 | Roy et al. | |
| 2017/0125349 A1 | 5/2017 | Roy et al. | |
| 2019/0041594 A1 * | 2/2019 | Li | G02B 6/43 |

FOREIGN PATENT DOCUMENTS

| | | |
|---|---|---|
| JP | 4989157 A | 8/1974 |
| JP | 8124967 A | 8/1974 |
| JP | 49089157 A | 2/1976 |
| JP | 2001223306 A | 8/2001 |
| JP | 2002084108 A | 3/2002 |
| JP | 2004111415 A | 4/2004 |
| JP | 2006261311 | 9/2006 |
| JP | 2009231635 A | 10/2009 |
| JP | 2009290144 A | 12/2009 |
| JP | 2011051584 | 3/2011 |
| JP | 2011515842 A | 5/2011 |
| JP | 2011139083 A | 7/2011 |
| JP | 4989157 B2 | 8/2012 |
| JP | 2014140022 A | 7/2014 |
| JP | 2016105484 A | 6/2016 |
| JP | 6677380 | 3/2020 |
| KR | 1020100116689 A | 11/2010 |
| KR | 101593277 B1 | 2/2016 |
| KR | 101706997 B1 | 2/2017 |
| SG | 2013093521 A | 7/2014 |
| TW | 200950034 A | 12/2009 |
| TW | 201121025 A | 6/2011 |
| TW | 201243970 A | 11/2012 |
| TW | 201442201 A | 11/2014 |
| TW | I556401 B | 11/2016 |
| WO | WO-0011919 A1 | 3/2000 |
| WO | WO-0217392 A2 | 2/2002 |
| WO | WO-2014098966 A1 | 6/2014 |

OTHER PUBLICATIONS

"U.S. Appl. No. 13/722,203, Corrected Notice of Allowance dated Sep. 18, 2015", 7 pgs.
"U.S. Appl. No. 13/722,203, Corrected Notice of Allowance dated Oct. 13, 2015", 3 pgs.
"U.S. Appl. No. 13/722,203, Examiner Interview Summary dated May 6, 2015", 3 pgs.
"U.S. Appl. No. 13/722,203, Non Final Office Action dated Mar. 4, 2015", 10 pgs.
"U.S. Appl. No. 13/722,203, Notice of Allowance dated Aug. 14, 2015", 10 pgs.
"U.S. Appl. No. 13/722,203, Response filed Jul. 2, 2015 ato Non Final Office Action dated Mar. 4, 2015", 8 pgs.
"U.S. Appl. No. 13/722,203, Response filed Dec. 3, 2014 to Restriction Requirement dated Oct. 3, 2014", 9 pgs.
"U.S. Appl. No. 13/722,203, Restriction Requirement dated Oct. 3, 2014", 12 pgs.
"U.S. Appl. No. 14/992,535, Corrected Notice of Allowance dated Aug. 17, 2016", 5 pgs.
"U.S. Appl. No. 14/992,535, Corrected Notice of Allowance dated Dec. 14, 2016", 6 pgs.

(56) References Cited

OTHER PUBLICATIONS

"U.S. Appl. No. 14/992,535, Notice of Allowance dated Jul. 14, 2016", 10 pgs.

"U.S. Appl. No. 14/992,535, Preliminary Amendment filed Jan. 12, 2016", 6 pgs.

"U.S. Appl. No. 15/350,393, Notice of Allowance dated Jan. 22, 2018", 10 pgs.

"U.S. Appl. No. 15/350,393, Notice of Allowance dated Jun. 1, 2018", 10 pgs.

"U.S. Appl. No. 15/350,393, Notice of Allowance dated Sep. 7, 2017", 10 pgs.

"U.S. Appl. No. 15/350,393, Preliminary Amendment filed Jan. 25, 2017", 7 pgs.

"Chinese Application Serial No. 201310757213.4, Office Action dated Apr. 5, 2016", 10 pgs.

"Chinese Application Serial No. 201310757213.4, Response filed Aug. 16, 2016 to Office Action dated Apr. 5, 2016", with English translation of claims, 12 pgs.

"European Application Serial No. 13196337.3, Extended European Search Report dated May 14, 2014", 6 pgs.

"European Application Serial No. 17188479.4, Extended European Search Report dated Dec. 15, 2017", 8 pgs.

"International Application Serial No. PCT/US2013/044440, International Preliminary Report on Patentability dated Jul. 2, 2015", 6pgs.

"International Application Serial No. PCT/US2013/044440, International Search Report dated Nov. 28, 2013", 4 pgs.

"International Application Serial No. PCT/US2013/044440, Written Opinion dated Nov. 28, 2013", 4 pgs.

"Japanese Application Serial No. 2013-252669, Decision of Rejection dated Aug. 11, 2015", 4 pgs.

"Japanese Application Serial No. 2013-252669, Office Action dated Mar. 15, 2016", (English Translation), 4 pgs.

"Japanese Application Serial No. 2013-252669, Office Action dated Oct. 11, 2016", w/ machine translation from Google Translate, 11 pgs.

"Japanese Application Serial No. 2013-252669, Office Action dated Nov. 18, 2014", 4 pgs.

"Japanese Application Serial No. 2013-252669, Response filed Feb. 18, 2015 to Office Action dated Nov. 18, 2014", w/ English Translation, 11 pgs.

"Japanese Application Serial No. 2013-252669,Response filed Mar. 31, 2016 to Office Action dated Mar. 15, 2016", w/ English Translation, 10 pgs.

"Japanese Application Serial No. 2015-241109, Examiners Decision of Final Refusal dated Dec. 5, 2017", w/ English translation, 7 pgs.

"Japanese Application Serial No. 2015-241109, Office Action dated Feb. 7, 2017", w/English Translation, 12 pgs.

"Japanese Application Serial No. 2015-241109, Office Action dated Jun. 1, 2018", w/ English translation, 8 pgs.

"Japanese Application Serial No. 2015-241109, Response filed Jun. 26, 2017 to Office Action dated Feb. 7, 2017", w/ claims in English, 14 pgs.

"Korean Application Serial No. 2013-0157445, Office Action dated Sep. 11, 2015", 7 pgs.

"Korean Application Serial No. 2013-0157445, Response filed Oct. 14, 2015 to Office Action dated Sep. 11, 2015", wi English Claims, 21 pgs.

"Korean Application Serial No. 2016-0012342, Office Action dated May 1, 2016", w/ English Translation, 5 pgs.

"Korean Application Serial No. 2016-0012342, Response filed Jul. 1, 2016 to Office Action dated May 1, 2016", W/ English Translation of Claims, 18 pgs.

"Taiwanese Application Serial No. 102145384, Office Action dated Apr. 1, 2015", 19 pgs.

"Taiwanese Application Serial No. 102145384, Office Action dated Jul. 14, 2015", 19 pgs.

"Taiwanese Application Serial No. 102145384, Response filed Jun. 24, 2015 to Office Action dated Apr. 1, 2015", w/ English Claims, 11 pgs.

"Taiwanese Application Serial No. 102145384, Response filed Sep. 15, 2015 to Office Action dated Jul. 14, 2015", w/ English Claims, 16 pgs.

"Japanese Application Serial No. 2018-070970, Response filed Sep. 20, 2019 to Notification of Reasons for Refusal dated Jun. 25, 2019", w English claims, 7 pgs.

"European Application Serial No. 17188479.4, Response filed Jul. 23, 2018 to Extended European Search Report dated Feb. 15, 2017", 26 pgs.

"Japanese Application Serial No. 2015-241109, Notification of Reasons for Rejection dated May 7, 2019", W English Translation, 4 pgs.

"Japanese Application Serial No. 2015-241109, Response filed May 30, 2019 to Notification of Reasons for Rejection dated May 7, 2019", w English claims, 10 pgs.

"Japanese Application Serial No. 2018-070970, Notification of Reasons for Refusal dated Jun. 25, 2019", W English Translation, 13 pgs.

"Brazil Application Serial No. BR1020130324060, Office Action dated Feb. 18, 2020", W English Translation, 5 pgs.

\* cited by examiner

HIGH DENSITY ORGANIC BRIDGE DEVICE AND METHOD

CROSS-REFERENCE TO RELATED APPLICATION

This application is a continuation of U.S. application Ser. No. 15/350,393, filed Nov. 14, 2016, which is a continuation of U.S. patent application Ser. No. 14/992,535, now issued as U.S. Pat. No. 9,548,264, which is a continuation of U.S. patent application Ser. No. 13/722,203, filed Dec. 20, 2012, now issued as U.S. Pat. No. 9,236,366, each of which are incorporated by reference herein in their entirety.

TECHNICAL FIELD

Embodiments pertain to integrated circuit (IC) dies, multi-chip packages, and associated methods. More particularly, embodiments pertain to using an organic bridge in an organic package substrate to interconnect dies with a high density interconnect.

BACKGROUND

In order to enhance performance, processing unit products are increasingly integrating multiple die within the processing unit package in a side-by-side or other multi-chip-module (MCM) format. In traditional MCM format, the chip die are interconnected via connections within the substrate. One way to increase the input-output (IO) capacity is to connect the die through embedded IO bridge die featuring a very high wiring density locally between die. Patterning dense metal features on a silicon substrate is the conventional fabrication approach. This enables very fine feature, size consistent backend metallization, and a great number of IO interconnections. However, there is a significant mismatch between the coefficient of thermal expansion (CTE) of an organic package and a silicon bridge, leading to delamination and cracking between multiple materials. With multiple process steps used in production of the MCM after the silicon bridge has been placed in the substrate, the manufacturing process itself can lead to cracking and delamination. Additionally, embedding an external bridge made out of silicon to increase the local IO makes the silicon bridge ultra-thin and embedding the silicon bridge within the substrate can be challenging.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
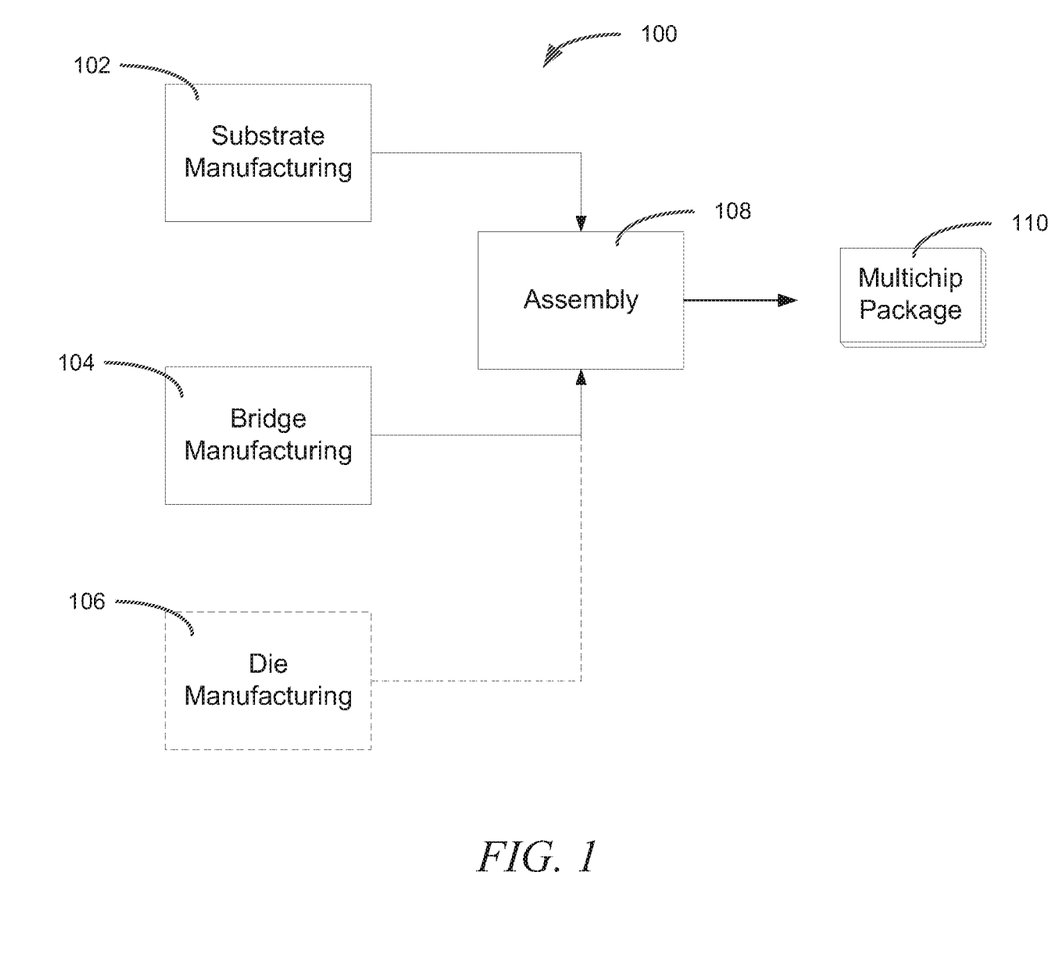
FIG. 1 illustrates a general microelectronic process according to some embodiments.

FIG. 1 illustrates a general microelectronic process according to some embodiments. The process, illustrated generally as 100, takes assemblies made from a substrate manufacturing process 102, a bridge manufacturing process 104 and assembles them as shown in 108 to produce a microelectronic package/device such as multichip package 110.

Die manufacturing process 106 is illustrated in dashed form to indicate that the die can be assembled on the substrate and bridge in the same process 108 or in a separate process at a later time. Die manufacturing process 106 can be any process sufficient to produce desired dies that will be incorporated into the final product. No further description of die manufacturing 106 will be given as it is not important to the disclosure herein.

Substrate manufacturing process 102 may comprise any process to produce a suitable package substrate that may be used, for example, in multi-chip packaging. Separate substrate manufacturing process 102 allows the process to be tuned effectively for the particular package substrate. In general, this means that the package substrates and process 102 can be tailored to only those aspects driven by the package substrate (and the bridge placement) and not those aspects driven by the bridge itself. In general, this allows using a less expensive process, a process that provides a higher yield, a higher volume, more relaxed geometries on conductors on and within the package substrate, a combination of all of these, or some other particular criteria or combination of criteria. Typically package substrates are made from an organic polymer such as an epoxy. Package substrates may have a variety of materials such as silica, calcium oxide, magnesium oxide, etc., added to the organic polymer to achieve particular properties such as a desired glass transition temperature or other desired properties.

Package substrates produced by substrate manufacturing process 102 may include various layers and geometries such as wires and connection points. In one example, substrates can be produced using design rules of about a 40 μm wire width and about a 40 μm wire spacing. Similarly, build-up layers, if any, can be thicker than those used by bridge manufacturing process 104 to produce organic bridges.

Bridge manufacturing process 104 may comprise a process to produce a high density interconnect bridge suitable for placement in the package substrate. An example process is discussed conjunction with FIG. 4 below. Bridges may be made from an organic polymer such as an epoxy without its own substrate (e.g. with only a few build-up layers or a single build-up layer comprising routing and pad layers). In one embodiment organic bridges produced by bridge manufacturing process 104 are less than about 30 μm thick. In another embodiment, organic bridges produced by bridge manufacturing process 104 are about 15 μm thick.

In embodiments of the bridge that have no substrate, when the bridge is placed on the package substrate as part of assembly process 108, the bridge conforms to the contours of the layer in the package substrate beneath it. This helps minimize inter-material issues such as cracking, chipping or delamination. The thinness of the bridge makes it easier to satisfy any z-height requirements of the process and/or package. For embodiments manufactured without a substrate, bridge manufacturing process 104 can use low cost, reusable glass carriers.

The organic polymer used in bridge manufacturing process 104 to produce organic bridges may be the same as, or different from, the organic polymer of the substrate. Since both materials are organic, the organic bridges have better interfacial adhesion (compared, for example, to bridges made out of silicon). Since both materials are organic, cracking, chipping, delamination and other issues associated with use of dissimilar materials can be minimized.

Bridge manufacturing process 104 may be designed to produce small, high density geometries in the bridge to carry high density IO interconnects. In one embodiment, organic bridge manufacturing process 104 uses design rules of about 3 μm or less wire width and about 3 μm or less wire spacing. In another embodiment, organic bridge manufacturing process 104 uses design rules of about 3 μm or less in wire width and spacing in some areas or layers and wider wire width and spacing in other areas or layers of the bridge (e.g., about 10 μm wire width and about 10 μm wire spacing).

Figure 2:
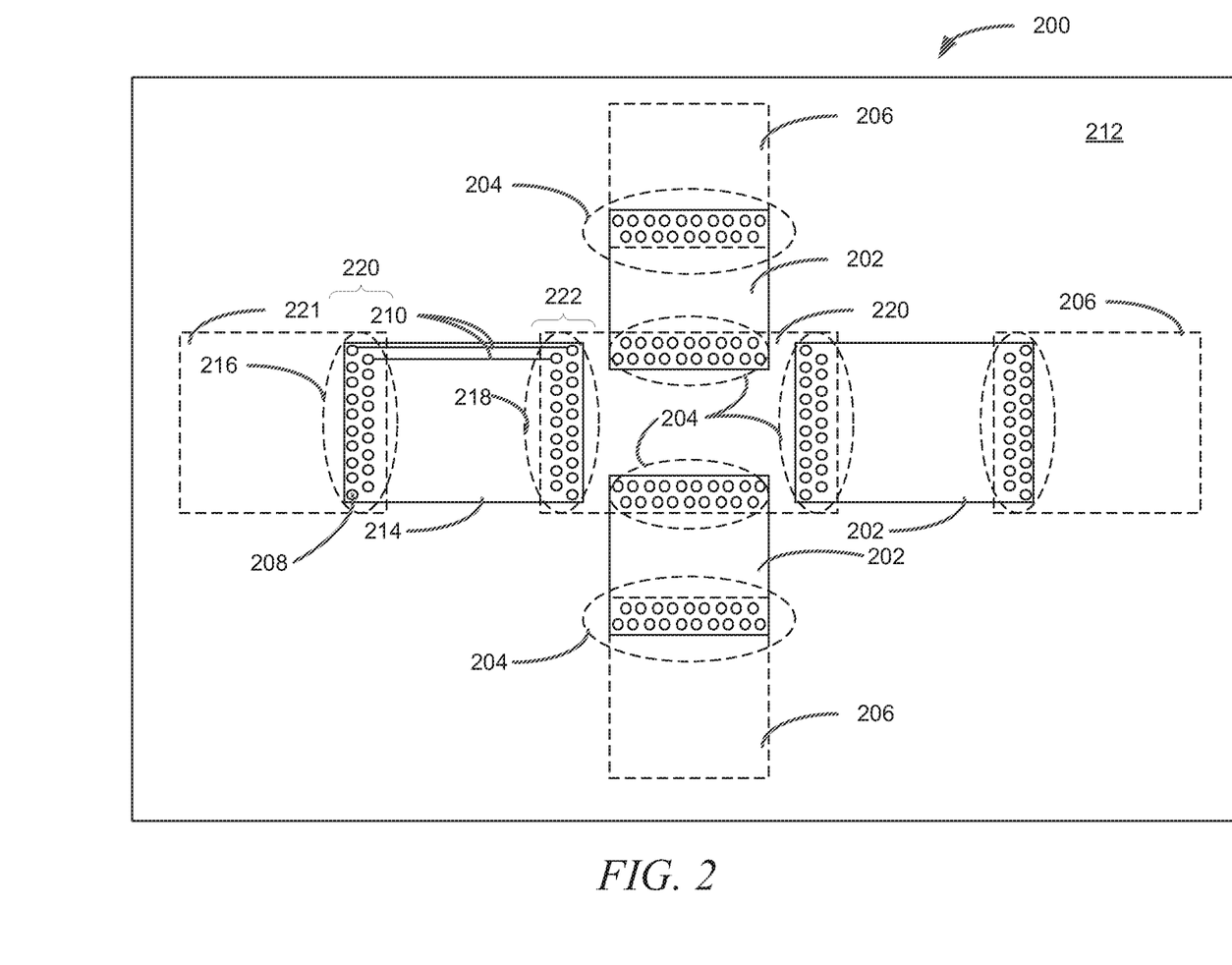
FIG. 2 illustrates a plan view of a microelectronic package according to some embodiments.

FIG. 2 illustrates a plan view of a microelectronic package according to some embodiments. The package 200 has package substrate 212 and an organic bridge 214 embedded in package substrate 212. Package substrate 212 may comprise an organic polymer such as an epoxy. Organic bridge 214 may also comprise an organic polymer such as an epoxy. The organic polymer of organic bridge 214 may be the same as, or different from, the organic polymer of package substrate 212.

Organic bridge 214 comprises an interconnect structure 216 located at a location 220 and an interconnect structure 218 located at a location 222. Interconnect structure 216 and interconnect structure 218 may comprise a plurality of connection points, such as the connection point illustrated as 208. The various connection points within interconnect structure 216 and 218 are connected by conductive paths. In FIG. 2, example conductive paths are illustrated by 210. Connections between the various connection points are appropriate to the die that will be interconnected by organic bridge 214. Locations 220 and 221, shown in dashed lines, indicate the locations where die interconnected by organic bridge 214 will be placed.

Interconnect structures 216 & 218 on an organic bridge 214 are typically located toward an end of the organic bridge 214. Thus, locations 220 and 222 are typically toward the ends of organic bridge 214. However, the location of interconnect structures 216 & 218 are determined by the die that will be interconnected by the organic bridge 214.

Microelectronic package 200 may comprise multiple organic bridges 214, each having multiple interconnect structures 216 & 218 in order to interconnect multiple die. In FIG. 2, additional organic bridges are illustrated by 202, interconnect structures are illustrated by 204 and die placement locations are illustrated in dashed lines by 206. These organic bridges 202 may be similar to organic bridge 214. Interconnect structures 204 may be similar to interconnect structure 216 and/or interconnect structure 218.

Figure 3:
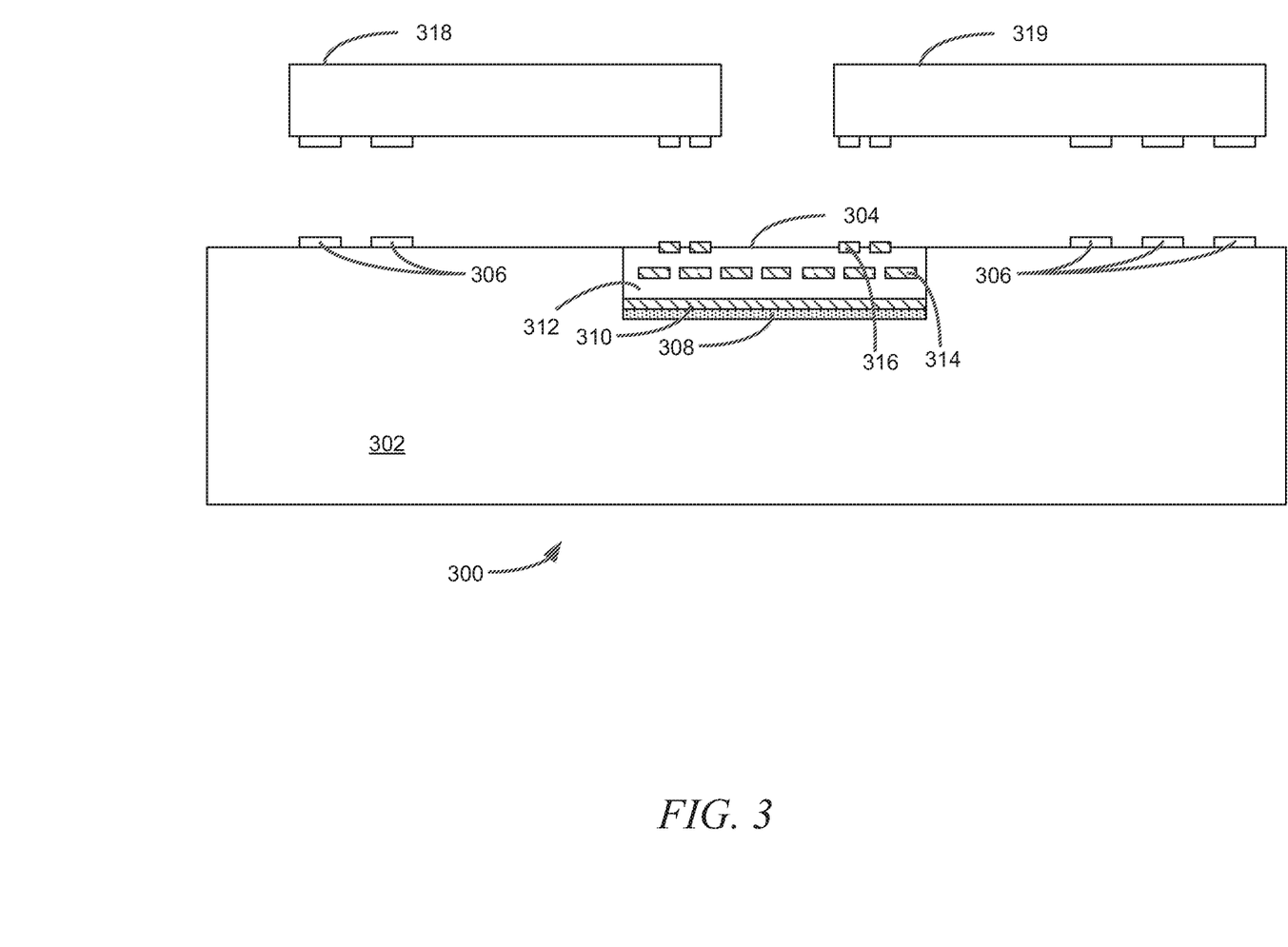
FIG. 3 illustrates a cross sectional view of an organic bridge placed within a substrate according to some embodiments.

FIG. 3 illustrates a cross sectional view of an organic bridge 202 placed within a substrate according to some embodiments. The assembly, illustrated generally as 300, may comprise a substrate 302 and an organic bridge 304. Substrate 302 may be a package substrate 302, such as that manufactured by substrate manufacturing process 102 of FIG. 1 and may comprise an organic polymer such as an epoxy.

Substrate 302 may comprise connection points 306 to connect a die, such as die 318 and 319 to substrate 302. Connection points 306 and associated conductive paths (not shown) may adhere to design rules appropriate for substrate 302. In one embodiment, the design rules of substrate 302 allow larger geometries (for e.g. connection points 306) than the design rules of embedded organic bridge 304. In one example, substrate 302 can be produced using design rules of about a 40 μm wire width and about a 40 μm wire spacing. Similarly, build-up layers, if any, can be thicker than those in organic bridge 304.

Substrate 302 has a recess to receive organic bridge 304. Depending on the thickness of the dielectric and other layers of substrate 302 and the thickness of organic bridge 304, the recess may only need to extend into the outermost layer or multiple outermost layers. Such a recess can be formed within substrate 302, for example, by using laser scribing.

Organic bridge 304 may comprise an organic polymer such as an epoxy. The organic polymer of organic bridge 304 may be the same as, or different from, the organic polymer of substrate 302. For clarity, some of the various layers of organic bridge 304 are illustrated in various patterns so they can be distinguished from the surrounding items.

Organic bridge 304 is placed into a recess of substrate 302 using an organic polymer to adhere organic bridge 304 into the recess. The organic polymer can be a dye bonding film, an epoxy, or any other type of organic polymer that sufficiently adheres organic bridge 304 to substrate 302. In FIG. 3, bonding organic bridge 304 to substrate 302 is illustrated by 308. Since substrate 302 and organic bridge 304 both comprise an organic polymer, layer 308 can adhere organic bridge 304 to substrate 302 in a way that minimizes problems arising from the interface of two dissimilar materials such as chipping, cracking and delamination.

Organic bridge 304 is represented in FIG. 3 by layer 310, 312 and 314 and 316. Layer 310 represents a metal layer within organic bridge 304, which may be included as part of the bridge 304. Layer 314 represents a metal routing layer embedded within dielectric layer 312. Dielectric layer 312 comprises an organic polymer such as an epoxy and represents interleaved dielectric layers 312. Layer 316 represents a pad layer where, for example, interconnect structures 204 can be formed as part of organic bridge 304. In one embodiment, the design rules for organic bridge 304 comprise about 3 μm or less wire width and about 3 μm or less wire spacing. In another embodiment, the design rules for organic bridge 304 comprises about 3 μm or less in wire width and spacing in some areas or layers and wider wire width and spacing in other areas or layers of the bridge (e.g., about 10 μm wire width and about 10 μm wire spacing).

Some embodiments of organic bridge 304 have no substrate 302. Such embodiments may comprise routing and pad layers 314 & 316 and, possibly some additional metal layers all with interleaved dielectric layers 312 but without, for example, a substrate 302. Having no substrate 302 means that those embodiments of organic bridge 304 have no layer that has substantial silicon content. In such embodiments, any "substrate" layer would be made substantially of a metal or an organic polymer such as an epoxy. The organic polymer may include various additives such as silica, calcium oxide, magnesium oxide, or other additive to modify certain desired properties of the organic polymer.

In one embodiment organic bridge 304 has no substrate 302 and is about 15 μm thick. In another embodiment organic bridge 304 has no substrate 302 and is less than about 20 μm thick. In yet another embodiment organic bridge 304 has no substrate 302 and is less than about 30 μm thick. Since organic bridge 304 has no substrate 302, it tends to conform to the contours of the recess into which it is placed. In such embodiments, the lack of a substrate 302 and the thinness of organic bridge 304 allows organic bridge 304 to be incorporated into a solder mask cavity on the surface layer of the of substrate 302 and ultra fine pitch dies can be directly connected by thermo-compression based bonding.

Figure 4:
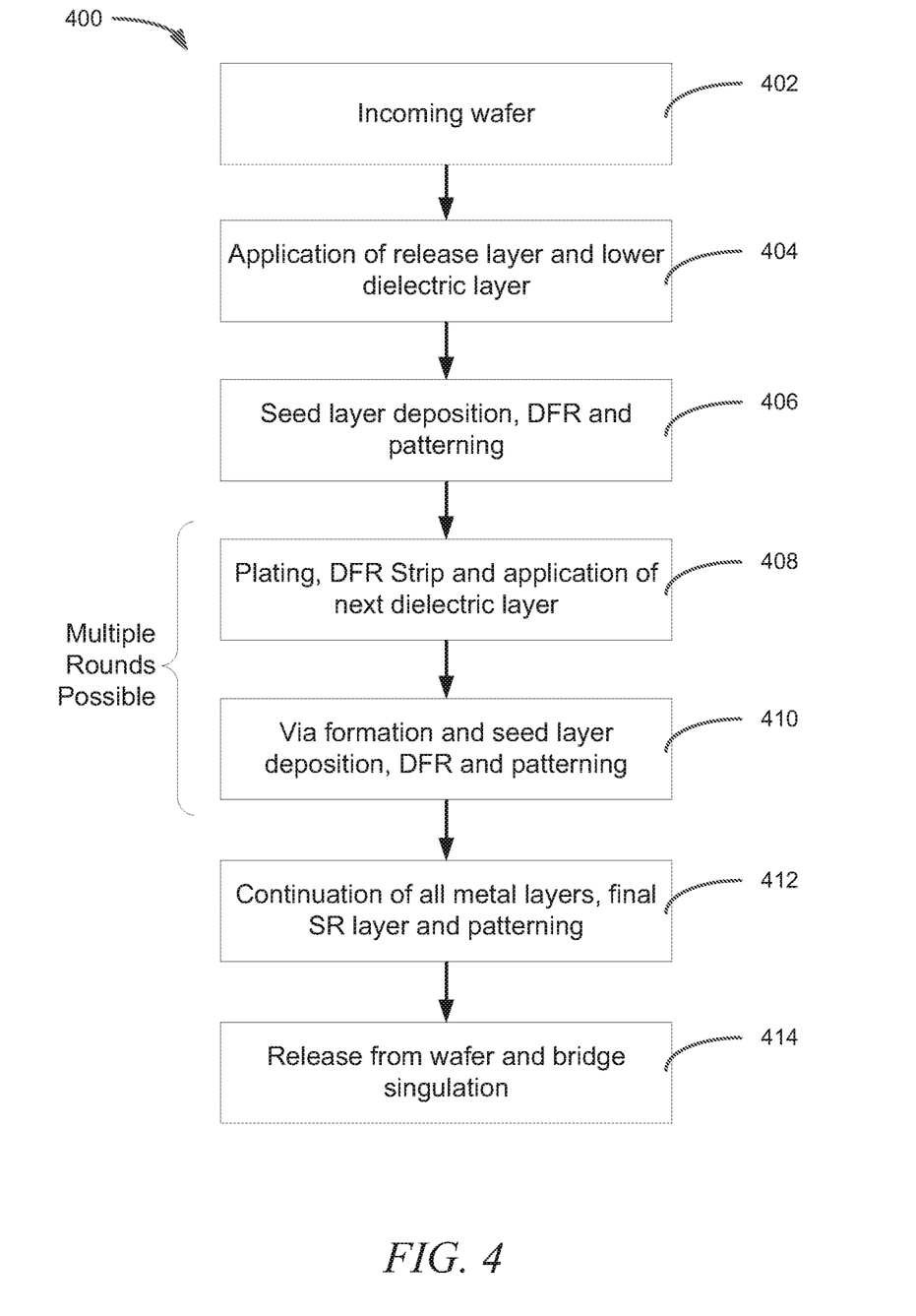
FIG. 4 illustrates a process to create an organic bridge according to some embodiments.

FIG. 4 illustrates a process to create an organic bridge 304 according to some embodiments. Such a process can be used, for example, in bridge manufacturing process 104 of FIG. 1. In FIG. 4, the process illustrated generally as 400 is a spin-on-glass (SoG) technique. SoG has the ability to provide finer trace and spacing than other processes, and thus is illustrated here. However, other processes may also be used.

In 402 a carrier wafer of silicon or glass is obtained. Since the incoming carrier wafer will not form part of the final organic bridge 304, inexpensive, reusable carrier wafers can be used for the process.

In 404 a release layer and the lower dielectric (SoG) layer is deposited. As previously described, the dielectric layer 312 comprises an organic polymer such as an epoxy.

In 406, seed layer deposition occurs, for example by sputtering. Dry file resist (DFR) and patterning of the seed layer also occurs.

In 408, plating occurs along with DFR stripping and application of the next dielectric layer 312 using SoG techniques.

In 410 via formation occurs along with seed layer deposition using, for example, sputtering. DFR application and patterning also occurs.

In 412 continuation of all metal layers occurs along with the final solder resist (SR) layer and patterning.

In 414 the resultant assembly is released from the carrier wafer and bridge singulation (e.g. separating the assembly into individual organic bridges 304) occurs.

In general, organic bridges 304, such as those described in conjunction with FIGS. 1-3, are only a few layers thick, perhaps only the routing layer 314, pad layer 316, ground and reference layers for the signal layers, plus interleaved dielectric layers 312. In such a situation, this two layer organic bridge 304 will be about 15 μm thick. However, if desired, the process illustrated in 408 and/or 410 can be repeated as appropriate to achieve an organic bridge 304 of perhaps three or four layers having a thickness of about 20 μm to about 30 μm.

The above detailed description includes references to the accompanying drawings, which form a part of the detailed description. The drawings show, by way of illustration, specific embodiments in which the disclosure may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments may be combined with each other in various combinations or permutations. The scope of the inventive material should be determined with reference to the appended claims, along with the full scope of equivalents to which such claims are entitled.

What s claimed is:

1. A microelectronic package comprising;
    an organic polymer substrate having a first wire width and first wire spacing;
    an organic polymer bridge embedded in the substrate having a second wire width and a second wire spacing;
    a first interconnect structure including connection points at a first location of the organic polymer bridge and a second interconnect structure including connection points at a second location of the organic polymer bridge;
    an electrically conductive path including a metal routing layer in the organic polymer bridge connecting the first interconnect structure to the second interconnect structure;
    a first die coupled to the first interconnect structure at the first location, and including bond pads that match the first wire width and first wire spacing, and bond pads that match the second wire width and second wire spacing; and
    a subsequent die coupled to the second interconnect structure including bond pads that match the first wire width and first wire spacing, and bond pads that match the second wire width and second wire spacing.

2. The microelectronic package of claim 1, further including:
    wherein the first wire width and first wire spacing exhibit a first set of design rules;
    wherein the second wire width and second wire spacing exhibit a second set of design rules;
    wherein the first wire width is larger than the second wire width and the first wire spacing is larger than the second wire spacing; and
    wherein the connection points are part of a metal pad layer.

3. The microelectronic package of claim 1, wherein the organic polymer substrate contains a recess and the organic polymer bridge is embedded into the recess using an organic polymer.

4. The microelectronic package of claim 3:
   wherein the organic polymer substrate contains a recess and the organic polymer bridge is embedded into the recess using an organic polymer; and
   wherein the organic polymer substrate and the organic polymer bridge are the same organic polymer.

5. The microelectronic package of claim 3:
   wherein the organic polymer substrate contains a recess and the organic polymer bridge is embedded into the recess using an organic polymer; and
   wherein the organic polymer substrate and the organic polymer bridge are made from different organic polymers.

6. The microelectronic package of claim 3:
   wherein the organic polymer substrate contains a recess and the organic polymer bridge is embedded into the recess using an organic polymer; and
   wherein the organic polymer used to bond the organic polymer bridge to the organic polymer substrate is selected from a die bonding film and an epoxy.

7. A microelectronic package comprising;
   an organic polymer substrate having a first wire width and first wire spacing;
   a first organic polymer bridge embedded in the substrate having a second wire width and a second wire spacing;
   a first interconnect structure including connection points at a first location of the first organic polymer bridge and a second interconnect structure including connection points at a second location of the first organic polymer bridge;
   an electrically conductive path including a metal routing layer in the first organic polymer bridge connecting the first interconnect structure to the second interconnect structure;
   a subsequent organic polymer bridge embedded in the substrate having a second wire width and a second wire spacing;
   a first interconnect structure at a first location of the subsequent organic polymer bridge and a second interconnect structure at a second location of the subsequent organic polymer bridge;
   an electrically conductive path including a metal routing layer in the subsequent organic polymer bridge connecting the first interconnect structure to the second interconnect structure;
   a first die coupled to the first interconnect structure at the first location, and including bond pads that match the first wire width and first wire spacing, and bond pads that match the second wire width and second wire spacing of the first organic polymer bridge;
   a subsequent die coupled to the second interconnect structure of the first organic polymer bridge, including bond pads that match the first wire width and first wire spacing, and bond pads that match the second wire width and second wire spacing; and
   a third die coupled to the second interconnect structure of the first organic polymer bridge, including bond pads that match the first wire width and first wire spacing, and bond pads that match the second wire width and second wire spacing.

8. The microelectronic package of claim 7, further including:
   a third organic polymer bridge embedded in the substrate having the second wire width and second wire spacing;
   a first interconnect structure at a first location of the third organic polymer bridge and a second interconnect structure at a second location of the third organic polymer bridge;
   an electrically conductive path including a metal routing layer in the third organic polymer bridge connecting the first interconnect structure to the second interconnect structure; and
   a fourth die coupled to the second interconnect structure.

9. The microelectronic package of claim 8, further including:
   wherein the first wire width and first wire spacing exhibit a first set of design rules;
   wherein each second wire width and second wire spacing exhibit a second set of design rules;
   wherein the first wire width is larger than the second wire width and the first wire spacing is larger than the second wire spacing; and
   wherein the connection points are part of a metal pad layer.

10. The microelectronic package of claim 9, wherein the organic polymer substrate contains a plurality of recesses and each organic polymer bridge is embedded into one of the plurality of recesses using an organic polymer.

11. The microelectronic package of claim 9:
    wherein the organic polymer substrate contains a plurality of recesses and each organic polymer bridge is embedded into one of the plurality of recesses using an organic polymer; and
    wherein the organic polymer substrate and each organic polymer bridge are made from the same organic polymer.

12. The microelectronic package of claim 9:
    wherein the organic polymer substrate contains a plurality of recess and each organic polymer bridge is embedded into one of the recesses using an organic polymer; and
    wherein the organic polymer substrate and the organic polymer bridges are made from different organic polymers.

13. The microelectronic package of claim 9:
    wherein the organic polymer substrate contains a plurality of recess and each organic polymer bridge is embedded into one of the recesses using an organic polymer; and
    wherein the organic polymer used to bond each organic polymer bridge to the organic polymer substrate is selected from a die bonding film and an epoxy.

14. The microelectronic package of claim 7, further including:
    a third organic polymer bridge embedded in the substrate having the second wire width and second wire spacing;
    a fourth die coupled to the third interconnect structure;
    a fourth organic polymer bridge embedded in the substrate having the second wire width and second wire spacing;
    a first interconnect structure at a first location of the fourth organic polymer bridge and a second interconnect structure at a second location of the fourth organic polymer bridge;
    a metal routing layer in the fourth organic polymer bridge connecting the first interconnect structure to the second interconnect structure; and
    a fifth die coupled to the second interconnect structure.

15. The microelectronic package of claim 14, further including:
wherein the first wire width and first wire spacing exhibit a first set of design rules;
wherein each second wire width and second wire spacing exhibit a second set of design rules;
wherein the first wire width is larger than the second wire width and the first wire spacing is larger than the second wire spacing; and
wherein the connection points are part of a metal pad layer.

16. The microelectronic package of claim 15, wherein the organic polymer substrate contains a recess and the organic polymer bridge is embedded into the recess using an organic polymer.

17. The microelectronic package of claim 15:
wherein the organic polymer substrate contains a recess and the organic polymer bridge is embedded into the recess using an organic polymer; and
wherein the organic polymer substrate and the organic polymer bridge are made from the same organic polymer.

18. The microelectronic package of claim 15:
wherein the organic polymer substrate contains a recess and the organic polymer bridge is embedded into the recess using an organic polymer; and
wherein the organic polymer substrate and the organic polymer bridge are made from different organic polymers.

19. The microelectronic package of claim 15:
wherein the organic polymer substrate contains a plurality of recesses and each organic polymer bridge is embedded into one of the recess using an organic polymer; and
wherein the organic polymer used to bond each organic polymer bridge to the organic polymer substrate is selected from a die bonding film and an epoxy.

20. A microelectronic package comprising;
an organic polymer substrate having a first wire width and first wire spacing;
a first organic polymer bridge embedded in the substrate having a second wire width and a second wire spacing;
a first interconnect structure at a first location of the first organic polymer bridge and a second interconnect structure at a second location of the first organic polymer bridge;
an electrically conductive path including a metal routing layer in the first organic polymer bridge connecting the first interconnect structure to the second interconnect structure;
a subsequent organic polymer bridge embedded in the substrate having a second wire width and a second wire spacing;
a first interconnect structure at a first location of the subsequent organic polymer bridge and a second interconnect structure at a second location of the subsequent organic polymer bridge;
an electrically conductive path including a metal routing layer in the subsequent organic polymer bridge connecting the first interconnect structure to the second interconnect structure;
a first die coupled to the first interconnect structure of the first organic polymer bridge at the first location, and including bond pads that match the first wire width and first wire spacing, and bond pads that match the second wire width and second wire spacing of the first organic polymer bridge;
a subsequent die coupled to the second interconnect structure of the first organic polymer bridge, including bond pads that match the first wire width and first wire spacing, and bond pads that match the second wire width and second wire spacing;
wherein the subsequent die is coupled to the first interconnect structure of the subsequent organic polymer bridge and
a third die coupled to the second interconnect structure of the subsequent organic polymer bridge, including bond pads that match the first wire width and first wire spacing, and bond pads that match the second wire width and second wire spacing.

21. The microelectronic package of claim 20, further including:
a third organic polymer bridge, including bond pads that match the first wire width and first wire spacing, and bond pads that match the second wire width and second wire spacing;
wherein the third organic polymer bridge is oriented and coupled to the subsequent die; and
a fourth die coupled to the third organic polymer bridge.

22. The microelectronic package of claim 20, further including:
a third organic polymer bridge, including bond pads that match the first wire width and first wire spacing, and bond pads that match the second wire width and second wire spacing;
wherein the third organic polymer bridge is oriented and coupled to the subsequent die;
a fourth die coupled to the third organic polymer bridge;
a fourth organic polymer bridge, including bond pads that match the first wire width and first wire spacing, and bond pads that match the second wire width and second wire spacing;
wherein the fourth organic polymer bridge is oriented and coupled to the subsequent die;
a fifth die coupled to the fourth organic polymer bridge.

* * * * *